(12) United States Patent
Colles et al.

(10) Patent No.: US 11,005,455 B2
(45) Date of Patent: May 11, 2021

(54) GENERATING VOLTAGE PULSE WITH CONTROLLABLE WIDTH

(71) Applicant: Silanna Asia Pte Ltd, Singapore (SG)

(72) Inventors: Joseph H. Colles, Bonsall, CA (US); Steven E. Rosenbaum, San Diego, CA (US); Stuart B. Molin, Carlsbad, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 16/375,053

(22) Filed: Apr. 4, 2019

(65) Prior Publication Data
US 2020/0321946 A1 Oct. 8, 2020

(51) Int. Cl.
| H03K 3/017 | (2006.01) |
| H03K 5/04 | (2006.01) |
| H03K 7/08 | (2006.01) |
| H03K 3/023 | (2006.01) |

(52) U.S. Cl.
CPC ............ H03K 3/017 (2013.01); H03K 3/023 (2013.01)

(58) Field of Classification Search
CPC ............ H03K 7/08; H03K 3/284; H03K 5/04; H03K 5/1565; H03K 5/13
USPC .................................................. 327/172–178
See application file for complete search history.

(56) References Cited

U.S. PATENT DOCUMENTS

| 5,220,203 A | 6/1993 | McMorrow, Jr. et al. |
| 5,541,543 A | 7/1996 | Arnaud |
| 6,828,836 B1 | 12/2004 | Barrow et al. |
| 7,106,130 B2* | 9/2006 | Gan ...................... H02M 3/156 323/268 |
| 7,548,047 B1* | 6/2009 | Dasgupta .............. H02M 3/156 323/283 |
| 7,816,967 B1* | 10/2010 | Nagarajan .............. H03K 4/502 327/291 |
| 2010/0007395 A1* | 1/2010 | Sugie ........................ H03K 4/50 327/178 |
| 2010/0035661 A1 | 2/2010 | Amano et al. |
| 2010/0117699 A1* | 5/2010 | Wu .......................... H02M 1/44 327/172 |
| 2015/0249454 A1* | 9/2015 | Giaconi ................ H03L 7/0814 375/376 |

* cited by examiner

*Primary Examiner* — Quan Tra
(74) *Attorney, Agent, or Firm* — MLO, a professional corp.

(57) ABSTRACT

A width of a voltage pulse signal is directly proportional to a difference between first and second resistances in a pulse generator. The voltage pulse signal is generated with a ramp signal, two reference voltages, and two comparators. The first reference voltage is generated with the first resistance and a first current, and the second reference voltage is generated with the second resistance and a second current. The first comparator produces a first comparator output in response to the first reference voltage and the ramp signal, and the second comparator produces a second comparator output in response to the second reference voltage and the ramp signal. A logic circuitry generates the voltage pulse signal in response to the two comparator outputs.

18 Claims, 5 Drawing Sheets

GENERATING VOLTAGE PULSE WITH CONTROLLABLE WIDTH

BACKGROUND

Pulse generator circuits are common in electronics for generating voltage pulses for a variety of purposes. Many different circuit topologies or designs can be used to achieve a desired output for the pulse amplitude and/or width. Some pulse generator designs use two comparators with inputs that result in triggering the comparator outputs at different times, so that the outputs can be used to control the voltage pulse signal. However, it is not easy to accurately control the comparator inputs in order to achieve high timing precision in the width of the resulting voltage pulse signal, particularly for very short pulse widths, e.g., less than 10 nanosecond durations.

Some two-comparator pulse generator designs use two ramp signals (one for each comparator) and a single reference voltage (provided to both comparators), so that the difference between the two ramp signals relative to the reference voltage results in triggering the comparators at different times. However, it can be difficult to coordinate the timing of both ramp signals in order to ensure that the generated voltage pulse has the desired width or duration, particularly if the ramp signals are nonlinear. Additionally, using the same circuit design in different implementations (for generating voltage pulses of different widths) often requires a complicated and/or time-consuming reanalysis or redesign of the components that generate the ramp signals.

Some other two-comparator pulse generator designs use a single ramp signal (provided to both comparators) and two different reference voltages (one for each comparator), so that the difference between the two reference voltages relative to the ramp signal and its slope results in triggering the comparators at different times. However, adjusting the slope of the ramp signal provides for a rather limited range for the width of the generated voltage pulse. Additionally, optimizing such circuitry for different implementations often requires a complicated and/or time-consuming reanalysis or redesign of the components that generate the ramp signal and the reference voltages.

SUMMARY

In accordance with some embodiments, an improved pulse generator that enables a relatively easy and high level of adjustability or programmability for the pulse width includes first and second reference voltage generators, a ramp generator, first and second comparators, and a logic circuitry. The first reference voltage generator generates a first reference voltage at a first voltage level based on a first resistance value. The second reference voltage generator generates a second reference voltage at a second voltage level based on a second resistance value that is different from the first resistance value. The ramp generator producing a ramp signal. The first comparator receives the first reference voltage and the ramp signal and produces a first comparator output in response thereto. The second comparator receives the second reference voltage and the ramp signal and produces a second comparator output in response thereto. The logic circuitry is connected to receive the first and second comparator outputs and to generate a pulse signal in response thereto. A rising edge of the pulse signal is caused by the first comparator output. A falling edge of the pulse signal is caused by the second comparator output. A width of the pulse signal is directly proportional to a difference between the first and second resistance values.

Additionally, in accordance with some embodiments, a method includes generating a first reference voltage at a first voltage level by applying a first current to a first resistor having a first resistance value; generating a second reference voltage at a second voltage level by applying a second current to a second resistor having a second resistance value that is different from the first resistance value; generating a ramp signal; generating a first comparator output based on the first reference voltage and the ramp signal; generating a second comparator output based on the second reference voltage and the ramp signal; and generating a pulse signal in response to the first and second comparator outputs. A rising edge of the pulse signal is caused by the first comparator output. A falling edge of the pulse signal is caused by the second comparator output. A width of the pulse signal is directly proportional to a difference between the first and second resistance values.

In some of the above embodiments, the ramp signal is linear within an operating range that includes the first and second voltage levels. In some embodiments, the pulse generator also includes a programmable resistance circuitry comprising first and second resistors having the first and second resistance values, respectively, wherein at least one of the first and second resistors is a programmable resistor; and a programmable data interface through which resistance data is received to set at least one of the first and second resistance values by programming the at least one of the first and second resistors. In some embodiments, the first reference voltage generator comprises the first resistor and a first current source; the first current source is connected to the first resistor to generate the first reference voltage at the first voltage level by providing a first current through the first resistor; the second reference voltage generator comprises the second resistor and a second current source; the second current source is connected to the second resistor to generate the second reference voltage at the second voltage level by providing a second current through the second resistor; at least one of the first and second voltage levels of at least one of the first and second reference voltages is set by setting the at least one of the first and second resistance values for the at least one of the first and second resistors; and the width of the pulse signal is set by setting the at least one of the first and second voltage levels. In some embodiments, at least one of the first and second current sources is a programmable current source; at least one of the first and second currents of the at least one of the first and second current sources is set according to current data received via the programmable data interface for the at least one of the first and second current sources; and the at least one of the first and second voltage levels is further set by setting the at least one of the first and second currents. In some embodiments, the ramp generator comprises a capacitor and a third current source; the third current source is connected to the capacitor to generate the ramp signal as a linear ramp signal within an operating range that includes the first and second voltage levels by providing a third current to the capacitor; the third current source is a programmable current source; the third current is set according to the current data via the programmable data interface also for the third current source; a slope of the linear ramp signal is set by setting the third current source; and the width of the pulse signal is further set by setting the slope of the linear ramp signal. In some embodiments, the first reference voltage generator comprises a first resistor and a first current source; the first resistor has the first resistance value; the first current source is connected to the first resistor to generate the first reference voltage at the first voltage level by providing a first current through the first resistor; the second reference voltage generator comprises a second resistor and a second current source; the second resistor has the second resistance value; and the second current source is connected to the second resistor to generate the second reference voltage at the second voltage level by providing a second current through the second resistor. In some embodiments, at least one of the first and second current sources is a programmable current source; the pulse generator further comprises a programmable data interface through which current data is received for programming the at least one of the first and second current sources; at least one of the first and second currents of the at least one of the first and second current sources is set according to the current data by programming the at least one of the first and second current sources; at least one of the first and second voltage levels is set by setting the at least one of the first and second currents; and the width of the pulse signal is set by setting the at least one of the first and second voltage levels. In some embodiments, the pulse generator also includes an integrated circuit chip that includes the first and second current sources, at least part of the ramp generator, the first and second comparators, and the logic circuitry; wherein at least one of the first and second resistors is external to the integrated circuit chip and selectable to set the width of the pulse signal.

In some embodiments, the method also includes receiving resistance data through a programmable data interface; setting the at least one of the first and second resistance values by programming the at least one of the first and second resistors according to the resistance data; and setting the width of the pulse signal by the setting of the at least one of the first and second resistance values. In some embodiments, the method also includes setting at least one of the first and second reference voltages by the setting of the at least one of the first and second resistance values; and further setting the width of the pulse signal by the setting of the at least one of the first and second reference voltages. In some embodiments, the method also includes receiving current data through the programmable data interface; setting the at least one of the first and second currents by programming the at least one of the first and second current sources according to the current data; and further setting the width of the pulse signal by the setting of the at least one of the first and second currents. In some embodiments, the generating of the ramp signal is performed by a third current source applying a third current to a capacitor; the third current source is programmable to set the third current; and the method also includes setting the third current by programming the third current source also according to the current data; and further setting the width of the pulse signal by the setting of the third current. In some embodiments, the generating of the first reference voltage further comprises providing the first current from a first current source to the first resistor; the generating of the second reference voltage further comprises providing the second current from a second current source to the second resistor; the generating of the ramp signal is performed by a ramp generator; the generating of the first comparator output further comprises a first comparator receiving the first reference voltage and the ramp signal and producing the first comparator output in response thereto; the generating of the second comparator output further comprises a second comparator receiving the second reference voltage and the ramp signal and producing the second comparator output in response thereto; and the generating of the pulse signal further comprises a logic circuitry receiving the first and second comparator outputs and generating the pulse signal in response thereto. In some embodiments, the first and second currents are provided by first and second current sources, respectively; at least one of the first and second current sources is programmable to set at least one of the first and second currents; and the method also includes receiving current data through a programmable data interface; setting the at least one of the first and second currents by programming the at least one of the first and second current sources according to the current data; and setting the width of the pulse signal by the setting of the at least one of the first and second currents. In some embodiments, the first and second current sources, at least part of the ramp generator, the first and second comparators, and the logic circuitry are included in an integrated circuit chip; and the first and second resistors are external to the integrated circuit chip and selectable to set the width of the pulse signal.

DETAILED DESCRIPTION

Figure 1:
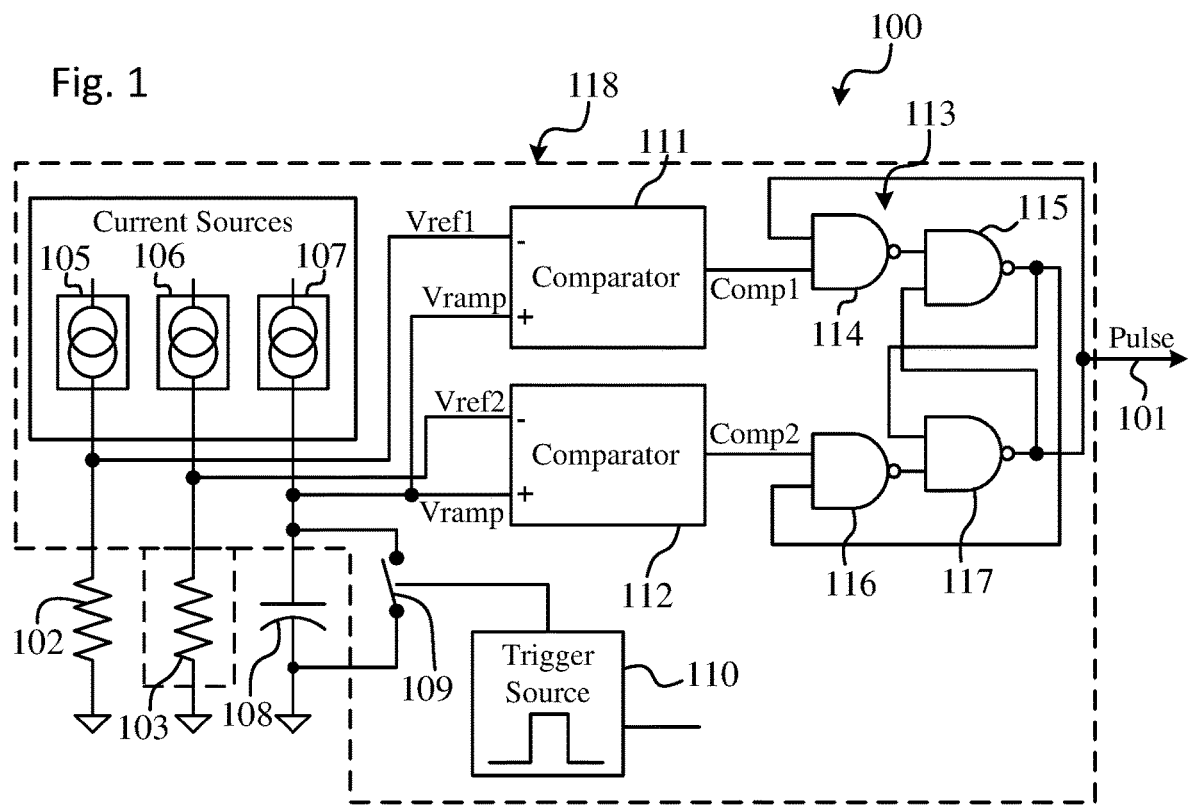
FIG. 1 is a simplified schematic diagram of an example improved pulse generator, in accordance with some embodiments.
Figure 2:
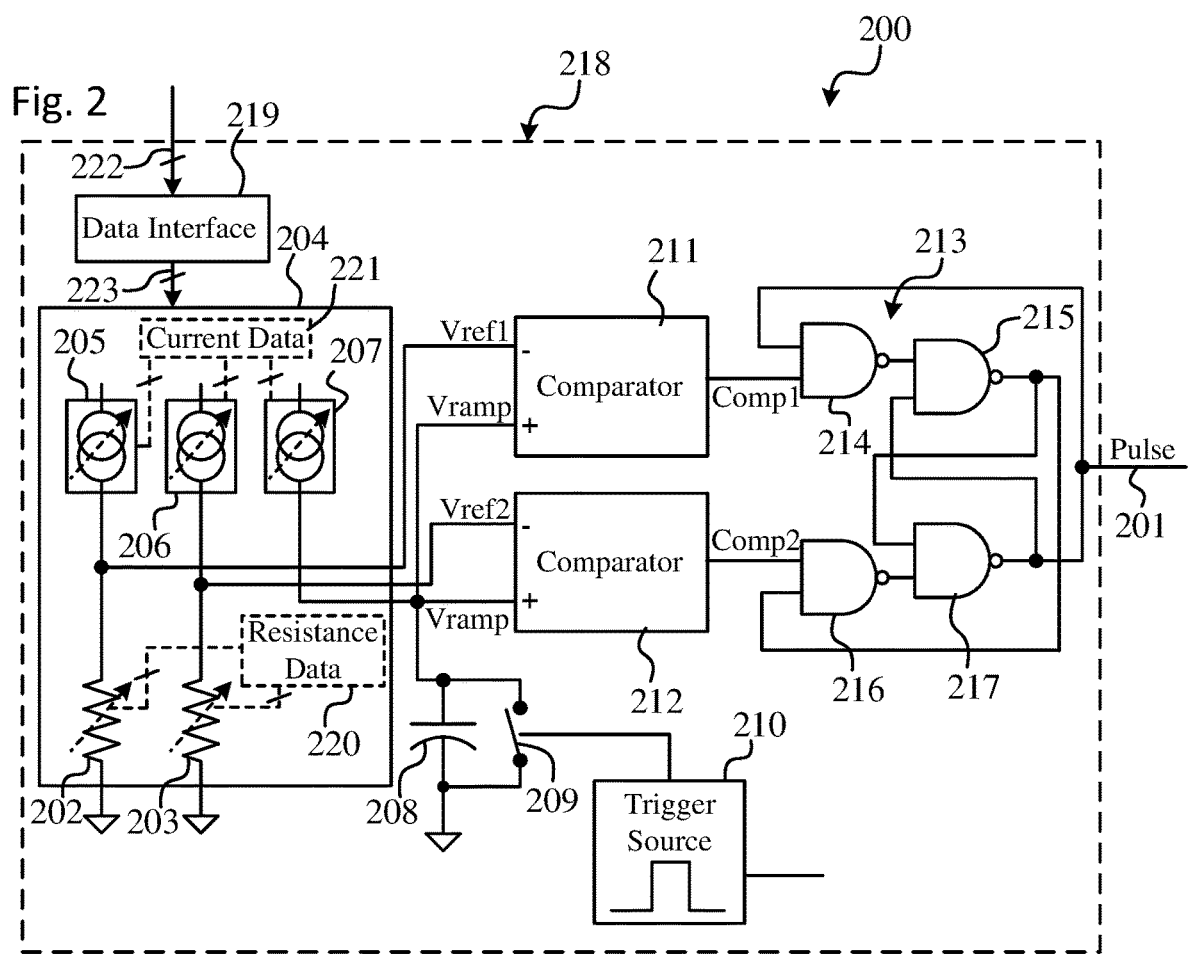
FIG. 2 is a simplified schematic diagram of another example improved pulse generator, in accordance with some embodiments.

An improved pulse generator 100 is shown in FIG. 1, in accordance with some embodiments. Another improved pulse generator 200 is shown in FIG. 2, in accordance with some embodiments. The pulse generators 100 and 200 generate voltage pulses (i.e., pulse signals) 101 and 201, respectively. The widths (i.e., time duration) of the voltage pulses 101 and 201 are directly proportional (i.e., linearly related) to a difference between two precisely controllable reference voltages. In some embodiments, the reference voltages are linearly controlled by two resistance values in conjunction with the levels of currents produced by current sources. For the pulse generator 100, the resistance values are set by two precision resistors 102 and 103 selected during the design and/or manufacturing of the pulse generator 100. For the pulse generator 200, the resistance values are set by a programmable circuitry 204 that receives a programming input during design, manufacturing and/or operation of the pulse generator 200. In some embodiments, the programmable circuitry 204 sets one or more of the current levels in addition to or instead of the resistance values. Since the widths of the voltage pulses 101 and 201 are based on a linear relationship to the difference between the reference voltages, which are based on a linear relationship to the difference between the resistance values and/or the current levels, it is relatively easy to design, program, redesign, reprogram or adjust the pulse generators 100 and 200 for different pulse widths for different implementations thereof by simply selecting different resistors 102 and 103 or providing a different programming input to the programmable circuitry 204 for at least one of the resistance values and/or at least one of the current levels. Additionally, it can be difficult to generate very short duration and highly precise voltage pulses, because it is difficult to precisely control the reference voltages, but the present invention enables such precise control. Consequently, the improved designs of the pulse generators 100 and 200 enable a high level of flexibility, adjustability and/or programmability for the pulse widths for the voltage pulses 101 and 201 that is not readily available for conventional pulse generator designs.

In some embodiments, the pulse generator 100 generally includes the first and second resistors 102 and 103, a plurality of (e.g., first, second and third) current sources 105, 106 and 107, a ramp capacitor 108, a ramp switch 109, a ramp trigger source 110, first and second "going-high" comparators 111 and 112, and logic circuitry 113, among other components not shown for simplicity. Additionally, the logic circuitry 113 includes NAND gates 114, 115, 116 and 117.

The first current source 105 and the first resistor 102 serve as a first reference voltage generator. The second current source 106 and the second resistor 103 serve as a second reference voltage generator. Thus, the first current source 105 (a precision current source that produces a first current) is connected to the first resistor 102 (having a first resistance value) as shown to generate a first reference voltage Vref1 at a first voltage level (based on the first current and the first resistance value) by providing the first current through the first resistor 102. Additionally, the second current source 106 (a precision current source that produces a second current) is connected to the second resistor 103 (having a second resistance value that is different from the first resistance value) as shown to generate a second reference voltage Vref2 at a second voltage level (based on the second current and the second resistance value) by providing a second current through the second resistor 103. The first reference voltage Vref1 is provided as a first set point to the negative ("−") input of the first comparator 111, and the second reference voltage Vref2 is provided as a second set point to the negative ("−") input of the second comparator 112.

The third current source 107, the ramp capacitor 108, the ramp switch 109, and the ramp trigger source 110 serve as a ramp generator for a voltage ramp signal Vramp. The ramp trigger source 110 (e.g., a square wave source) is connected to the ramp switch 109 to provide thereto a ramp trigger signal (e.g., a square wave) that turns the ramp switch 109 off and on. When the ramp trigger source 110 turns the ramp switch 109 off (i.e., the ramp switch 109 is opened), the third current source 107 charges up the ramp capacitor 108, thereby causing the voltage ramp signal Vramp (at a node between the third current source 107 and the ramp capacitor 108) to linearly ramp up. When ramping up, therefore, the voltage ramp signal Vramp is relatively linear within a desired operating range that includes at least the first voltage level of the first reference voltage Vref1 and the second voltage level of the second reference voltage Vref2. When the ramp trigger source 110 turns the ramp switch 109 on (i.e., the ramp switch 109 is closed), the output of the third current source 107 is shorted to ground (or other appropriate lower voltage limit), so the ramp capacitor 108 is discharged, thereby causing the voltage ramp signal Vramp (i.e., the voltage across the ramp capacitor 108) to rapidly decrease to ground or other appropriate lower voltage limit. In this manner, the voltage ramp signal Vramp is generally a sawtooth waveform. The voltage ramp signal Vramp is provided to the positive ("+") inputs of the first and second comparators 111 and 112.

The first and second comparators 111 and 112 (e.g., "going-high" comparators) use the same linear voltage ramp signal Vramp, but each comparator 111 and 112 is triggered at a different set point or reference voltage (i.e., Vref1 and Vref2, respectively), which is settable or determined by the resistance values of the resistors 102 and 103. The logic circuitry 113 is connected to receive the first and second comparator outputs Comp1 and Comp2 and to generate the voltage pulse 101 in response thereto. The configuration of the NAND gates 114-117 of the logic circuitry 113 ensures that, when the comparator output Comp1 of the first comparator 111 goes high, the voltage pulse 101 goes high, until the comparator output Comp2 of the second comparator 112 goes high, at which time the voltage pulse 101 goes low.

In some embodiments, the current sources 105 and 106 are designed to track or reference each other or are locked to each other or are tied together with the same reference current, so that the difference between the current levels of their produced currents can be very precisely controlled; thereby ensuring that the first and second reference voltages Vref1 and Vref2 can be tightly controlled. In some embodiments, the current source 107 is a highly precise current source and/or is referenced, tied or locked to the current sources 105 and 106; thereby ensuring that the voltage ramp signal Vramp is very highly linear within the desired operating range and/or has a precisely controlled or known slope. Each of these embodiments enables the first and second reference voltages Vref1 and Vref2 to be tightly linearly controlled at very precisely known voltage levels, so that the points at which the voltage ramp signal Vramp crosses the first and second reference voltages Vref1 and Vref2 (and, thus, the width of the voltage pulse 101) is also tightly controlled for very precise, narrow pulse widths.

Since the voltage ramp signal Vramp is relatively linear within the desired operating range that includes at least the first voltage level of the first reference voltage Vref1 and the second voltage level of the second reference voltage Vref2, the width of the voltage pulse 101 is directly proportional (i.e., linearly related) to a difference between the resistance values of the resistors 102 and 103. In other words, for a given slope of the voltage ramp signal Vramp, changing (i.e., increasing or decreasing) the difference between the resistance values of the resistors 102 and 103 by a factor of X will also change the width of the voltage pulse 101 by the factor of X due to a corresponding change (by the factor of X) in the difference between the reference voltages Vref1 and Vref2 or the set points for the comparators 111 and 112.

In some embodiments, the first and second current sources 105 and 106, at least part of the ramp generator (e.g., the third current source 107, the ramp switch 109, the ramp trigger source 110, and optionally the ramp capacitor 108), the first and second comparators 111 and 112, and the logic circuitry 113 (among other appropriate components) are included in an integrated circuit (IC) chip 118. In some embodiments, one of the resistors 102 and 103 is also included in the IC chip 118. Different embodiments may include different combinations of the components of the pulse generator 100 within the IC chip 118, as long as at least one (and in some cases both) of the first and second resistors 102 and 103 is external to the IC chip 118 and, thus, selectable for the purpose of setting the width of the voltage pulse 101. (The resistor 103 is shown with a dashed box around it as an indication that it is optional for one of the resistors 102 and 103 to be included in the IC chip 118 and for at least one, or both, of the resistors 102 and 103 to be external to the IC chip 118.)

Therefore, since the width of the voltage pulse 101 is directly proportional (i.e., linearly related) to a difference between the resistance values of the resistors 102 and 103, the pulse width can be set by a simple calculation based on the resistance values followed by an easy appropriate selection of one or both of the resistors 102 and 103, depending on whether one or both of the resistors 102 and 103 is external to the IC chip 118. In some embodiments, both of the resistors 102 and 103 are external to the IC chip 118 and are, thus, selectable for setting the width of the voltage pulse 101, so any appropriate resistance values for both resistors 102 and 103 can be calculated based on the desired resulting width of the voltage pulse 101. In some embodiments, one of the resistors 102 and 103 is internal to the IC chip 118 and, thus, not selectable for setting the width of the voltage pulse 101. In such embodiments, a known fixed resistance value for that resistor (e.g., 103) in combination with the desired resulting width of the voltage pulse 101 can be used to calculate the resistance value for the other resistor, i.e., the external resistor (e.g., 102). For example, in some embodiments, decreasing or increasing the resistance value of the first resistor 102 relative to the resistance value of the second resistor 103 will decrease or increase, respectively, the first voltage level of the first reference voltage Vref1 and, thus, increase or decrease, respectively, the width of the voltage pulse 101 in a linear relationship to the difference in the resistance values. Additionally, in some embodiments, decreasing or increasing the resistance value of the second resistor 103 relative to the resistance value of the first resistor 102 will decrease or increase, respectively, the second voltage level of the second reference voltage Vref2 and, thus, decrease or increase, respectively, the width of the voltage pulse 101 in a linear relationship to the difference in the resistance values. In other words, at least one of the first and second voltage levels of at least one of the first and second reference voltages Vref1 and Vref2 is set by setting at least one of the first and second resistance values for at least one of the first and second resistors 102 and 103. Consequently, the width of the voltage pulse 101 is set by setting at least one of the first and second voltage levels due to the setting of at least one of the first and second resistance values. Therefore, given an available operating range of the voltage ramp signal Vramp, the current levels provided by the first and second current sources 105 and 106, and the desired width of the voltage pulse 101, allowable resistance values can be calculated for one or both of the resistors 102 and/or 103, and then the resistors 102 and/or 103 can be selected for inclusion in the design for a desired implementation of the pulse generator 100. Additionally, for greater range in the pulse width, the calculation can also include the capacitance value of the ramp capacitor 108 and the level of the current provided by the third current source 107 and, thus, the slope and available operating range of the voltage ramp signal Vramp, i.e., for embodiments in which the ramp capacitor 108 is also external to the IC chip 118 and is, thus, selectable for a desired implementation of the pulse generator 100.

Therefore, in some embodiments, circuit designers can be provided with a simple formula with which appropriate selections for one or both of the resistance values and optionally for the capacitance value can be calculated given a desired pulse width. In other embodiments, a table can be easily created for a representative set of widths for the voltage pulse 101 cross correlated with the best predetermined recommended selection for one or both of the resistance values and optionally for the capacitance value, so the circuit designers can simply look up the predetermined selections.

In some embodiments, the pulse generator 200 generally includes the programmable circuitry 204, a ramp capacitor 208, a ramp switch 209, a ramp trigger source 210, first and second "going-high" comparators 211 and 212, logic circuitry 213, and a programmable data interface 219, among other components not shown for simplicity. The programmable circuitry 204 generally includes first and second resistors 202 and 203, a plurality of (e.g., first, second and third) current sources 205, 206 and 207, a resistance data register 220, and a current data register 221, among other components not shown for simplicity. Additionally, the logic circuitry 213 includes NAND gates 214, 215, 216 and 217.

The resistors 202 and 203 and the current sources 205, 206 and 207 are all shown as programmable variable components. Other embodiments generally include different combinations of programmable variable components and fixed components for the resistors 202 and 203 and the current sources 205, 206 and 207. For example, in some embodiments, at least one of the resistors 202 and 203 is a programmable variable resistor and/or at least one of the current sources 205, 206 and 207 is a programmable variable current source. When any of the resistors 202 and 203 or the current sources 205, 206 and 207 is not programmable, then it has a fixed known resistance value or produces a fixed known current, respectively. (The resistors 202 and 203 are both shown with a dashed arrow and a dashed control line as an indication that it is optional for the resistors 202 and 203 to be programmable or not.) When at least one of the resistors 202 and 203 is a programmable variable resistor, they may be referred to together as programmable resistance circuitry. When at least one of the current sources 205, 206 and 207 is a programmable variable current source, they may be referred to together as programmable current source circuitry. (The current sources 205, 206 and 207 are each shown with a dashed arrow and a dashed control line as an indication that it is optional for any of the current sources 205, 206 and 207 to be programmable or not.) In some embodiments, neither of the resistors 202 and 203 is programmable, but one or more of the current sources 205, 206 and 207 is programmable. In some embodiments, none of the current sources 205, 206 and 207 is programmable, but one or more of the resistors 202 and 203 is programmable.

In some embodiments, programming the resistors 202 and 203 is generally done by receiving or storing resistance data (data bits or bytes) into the resistance data register 220. Thus, the resistance data register 220 is connected to one or more of the resistors 202 and 203 via control signal lines for the bits or bytes of the data to control or set the resistance values thereof. In some embodiments, one or more of the resistors 202 and 203 can be set to known discrete resistance values corresponding to the possible data values of the resistance data. (The resistance data register 220 is shown with a dashed box as an indication that it is optional to include the resistance data register 220, depending on whether either of the resistors 202 and 203 is programmable or not.) Any appropriate or desired level of coarse or fine tuning of the resistance values and/or any appropriate or desired range of the resistance values can be achieved depending on the bit or byte size of the data values of the resistance data.

Similarly, in some embodiments, programming the current sources 205, 206 and 207 is generally done by receiving or storing current data (data bits or bytes) into the current data register 221. Thus, the current data register 221 is connected to one or more of the current sources 205, 206 and 207 via control signal lines for the bits or bytes of the data to control or set the current produced thereby. In some embodiments, therefore, at least one of the current sources 205, 206 and 207 can be set to produce currents of known discrete current levels corresponding to the possible data values of the current data. (The current data register 221 is shown with a dashed box as an indication that it is optional to include the current data register 221, depending on whether any of the current sources 205, 206 and 207 is programmable or not.) Any appropriate or desired level of coarse or fine tuning of the current levels and/or any appropriate or desired range of the current levels can be achieved depending on the bit or byte size of the data values of the current data.

The resistance data and/or the current data is received into the resistance data register 220 and/or the current data register 221, respectively, via the data interface 219. In some embodiments, the data interface 219 is a programmable serial data interface, e.g., according to the I2C serial protocol standard, the Serial Peripheral Interface (SPI) bus standard, or other appropriate programming interface. Data input lines 222, thus, communicatively connect the data interface 219 to external components, e.g., a microprocessor or IC chip I/O (input/output) pins, from or through which the resistance data and/or the current data is received. Additional data lines 223 communicatively connect the data interface 219 to the resistance data register 220 and/or the current data register 221 for storing the resistance data and/or the current data, respectively, therein.

The first current source 205 and the first resistor 202 serve as a first reference voltage generator. The second current source 206 and the second resistor 203 serve as a second reference voltage generator. Thus, the first current source 205 (a precision current source that produces a first current) is connected to the first resistor 202 (having, or being programmed to, a first resistance value) as shown to generate a first reference voltage Vref1 at a first voltage level (based on the first current and the first resistance value) by providing the first current through the first resistor 202. Additionally, the second current source 206 (a precision current source that produces a second current) is connected to the second resistor 203 (having, or being programmed to, a second resistance value) as shown to generate a second reference voltage Vref2 at a second voltage level (based on the second current and the second resistance value) by providing a second current through the second resistor 203. The first reference voltage Vref1 is provided as a first set point to the negative ("−") input of the first comparator 211, and the second reference voltage Vref2 is provided as a second set point to the negative ("−") input of the second comparator 212. When any of the resistors 202 and 203 and/or the current sources 205 and 206 is programmable, then at least one of the voltage levels of at least one of the reference voltages Vref1 and Vref2 is set by setting at least one of the resistance values for at least one of the resistors 202 and 203 and/or by setting at least one of the currents of the current sources 205 and 206.

In some embodiments, the current sources 205 and 206 produce currents with the same current levels, and the resistors 202 and 203 have different resistance value, so that the first and second reference voltages Vref1 and Vref2 are different. In some embodiments, the resistors 202 and 203 have the same resistance value, and the current sources 205 and 206 produce currents with different current levels, so that the first and second reference voltages Vref1 and Vref2 are different.

The third current source 207, the ramp capacitor 208, the ramp switch 209, and the ramp trigger source 210 serve as a ramp generator for a voltage ramp signal Vramp. Thus, the third current source 207 is connected to the ramp capacitor 208 to generate the voltage ramp signal Vramp. The ramp trigger source 210 (e.g., a square wave source) is connected to the ramp switch 209 to provide thereto a ramp trigger signal (e.g., a square wave) that turns the ramp switch 209 off and on. When the ramp trigger source 210 turns the ramp switch 209 off (i.e., the ramp switch 209 is opened), the third current source 207 charges up the ramp capacitor 208, thereby causing the voltage ramp signal Vramp (at a node between the third current source 207 and the ramp capacitor 208) to linearly ramp up. When ramping up, therefore, the voltage ramp signal Vramp is relatively linear within a desired operating range that includes at least the first voltage level of the first reference voltage Vref1 and the second voltage level of the second reference voltage Vref2. When the ramp trigger source 210 turns the ramp switch 209 on (i.e., the ramp switch 209 is closed), the output of the third current source 207 is shorted to ground (or other appropriate lower voltage limit), so the ramp capacitor 208 is discharged, thereby causing the voltage ramp signal Vramp (i.e., the voltage across the ramp capacitor 208) to rapidly decrease to ground or other appropriate lower voltage limit. In this manner, the voltage ramp signal Vramp is generally a sawtooth waveform. The voltage ramp signal Vramp is provided to the positive ("+") inputs of the first and second comparators 211 and 212. For embodiments in which the third current source 207 is programmable, the slope (and thus also the operating range) of the voltage ramp signal Vramp can be set by setting the level of the current for the third current source 207. Consequently, the width of the voltage pulse 201 is further set by setting the slope of the linear voltage ramp signal Vramp.

The first and second comparators 211 and 212 (e.g., "going-high" comparators) use the same linear voltage ramp signal Vramp, but each comparator 211 and 212 is triggered at a different set point or reference voltage (i.e., Vref1 and Vref2, respectively), which is settable or determined by the resistance values of the resistors 202 and 203. The logic circuitry 213 is connected to receive the first and second comparator outputs Comp1 and Comp2 and to generate the voltage pulse 201 in response thereto. The configuration of the NAND gates 214-217 of the logic circuitry 213 ensures that, when the output Comp1 of the first comparator 211 goes high, the voltage pulse 201 goes high, until the output Comp2 of the second comparator 212 goes high, at which time the voltage pulse 201 goes low.

Additionally, in some embodiments, the resistors 202 and 203 are designed to track or reference each other, so that the difference between their resistance values can be very precisely controlled; thereby ensuring that the first and second reference voltages Vref1 and Vref2 can be tightly controlled. In some embodiments, the current sources 205 and 206 are designed to track or reference each other or are locked to each other or are tied together with the same reference current, so that the difference between the current levels of their produced currents can be very precisely controlled; thereby ensuring that the first and second reference voltages Vref1 and Vref2 can be tightly controlled. In some embodiments, one or both of the first and second reference voltages Vref1 and Vref2 is generated by a highly accurate DAC (digital to analog converter). In some embodiments, the current source 207 is a highly precise current source and/or is referenced, tied or locked to the current sources 205 and 206; thereby ensuring that the voltage ramp signal Vramp is very highly linear within the desired operating range and/or has a precisely controlled or known slope. Each of these embodiments enables the first and second reference voltages Vref1 and Vref2 to be tightly linearly controlled at very precisely known voltage levels, so that the points at which the voltage ramp signal Vramp crosses the first and second reference voltages Vref1 and Vref2 (and, thus, the width of the voltage pulse 201) is also tightly controlled for very precise, narrow pulse widths.

Since the voltage ramp signal Vramp is relatively linear within the desired operating range that includes at least the first voltage level of the first reference voltage Vref1 and the second voltage level of the second reference voltage Vref2, the width of the voltage pulse 201 is directly proportional (i.e., linearly related) to a difference between the resistance values of the resistors 202 and 203. In other words, for a given slope of the voltage ramp signal Vramp, changing (i.e., increasing or decreasing) the difference between the resistance values of the resistors 202 and 203 by a factor of X will also change the width of the voltage pulse 201 by the factor of X due to a corresponding change (by the factor of X) in the difference between the reference voltages Vref1 and Vref2 or the set points for the comparators 211 and 212.

In some embodiments, the components 202-217 and 219-223 (among other appropriate components) are included in an IC chip 218. By including the resistors 202 and 203 in the IC chip 218, at least one of them can be controlled or programmed in combination with the current sources 205 and 206 (which can also be programmable in some embodiments) for the purpose of setting the width of the voltage pulse 201.

Therefore, since the width of the voltage pulse 201 is directly proportional (i.e., linearly related) to a difference between the resistance values of the resistors 202 and 203, the pulse width can be set by a simple calculation based on the resistance values followed by an easy appropriate programming of one or both of the resistors 202 and 203, depending on whether one or both of the resistors 202 and 203 is programmable. In some embodiments, both of the resistors 202 and 203 are programmable for setting the width of the voltage pulse 201, so any appropriate resistance values for both resistors 202 and 203 can be calculated based on the desired resulting width of the voltage pulse 201. In some embodiments, one of the resistors 202 and 203 simply has a known fixed resistance value, which can be used in combination with the desired resulting width of the voltage pulse 201 to calculate the resistance value for the other resistor, i.e., the programmable resistor. For example, in some embodiments, increasing or decreasing (i.e., setting) the resistance value of the first resistor 202 relative to the resistance value of the second resistor 203 will increase or decrease, respectively, (i.e., set) the first voltage level of the first reference voltage Vref1 and, thus, the width of the voltage pulse 201 in a linear relationship to the difference in the resistance values. Additionally, in some embodiments, decreasing or increasing (i.e., setting) the resistance value of the second resistor 203 relative to the resistance value of the first resistor 202 will decrease or increase, respectively, (i.e., set) the second voltage level of the second reference voltage Vref2 and, thus, increase or decrease, respectively, (i.e., set) the width of the voltage pulse 201 in a linear relationship to the difference in the resistance values. In other words, at least one of the first and second voltage levels of at least one of the first and second reference voltages Vref1 and Vref2 is set by setting at least one of the first and second resistance values for at least one of the first and second resistors 202 and 203. Consequently, the width of the voltage pulse 201 is set by setting at least one of the first and second voltage levels due to the setting of at least one of the first and second resistance values. Therefore, given an available operating range of the voltage ramp signal Vramp, the current levels provided by the first and second current sources 205 and 206 (whether or not programmable), and the desired width of the voltage pulse 201, allowable resistance values can be calculated for one or both of the resistors 202 and/or 203, and then the resistors 202 and/or 203 can be programmed during the design, manufacturing or operation of a desired implementation of the pulse generator 200. Additionally, for greater range in the pulse width, the calculation can also include the capacitance value of the ramp capacitor 208 and the level of the current provided by the third current source 207 and, thus, the slope and available operating range of the voltage ramp signal Vramp, e.g., for embodiments in which the third current source 207 is also programmable for a desired implementation of the pulse generator 200.

Therefore, in some embodiments, circuit designers can be provided with a simple formula with which appropriate selections for one or both of the resistance values of the resistors 202 and 203 and optionally for one or more of the currents of the current sources 205-207 can be calculated given a desired pulse width. In other embodiments, a table can be easily created for a representative set of widths for the voltage pulse 201 cross correlated with the best predetermined recommended selection for one or both of the resistance values and optionally for one or more of the currents, so the circuit designers can simply look up the predetermined selections.

Figure 3:
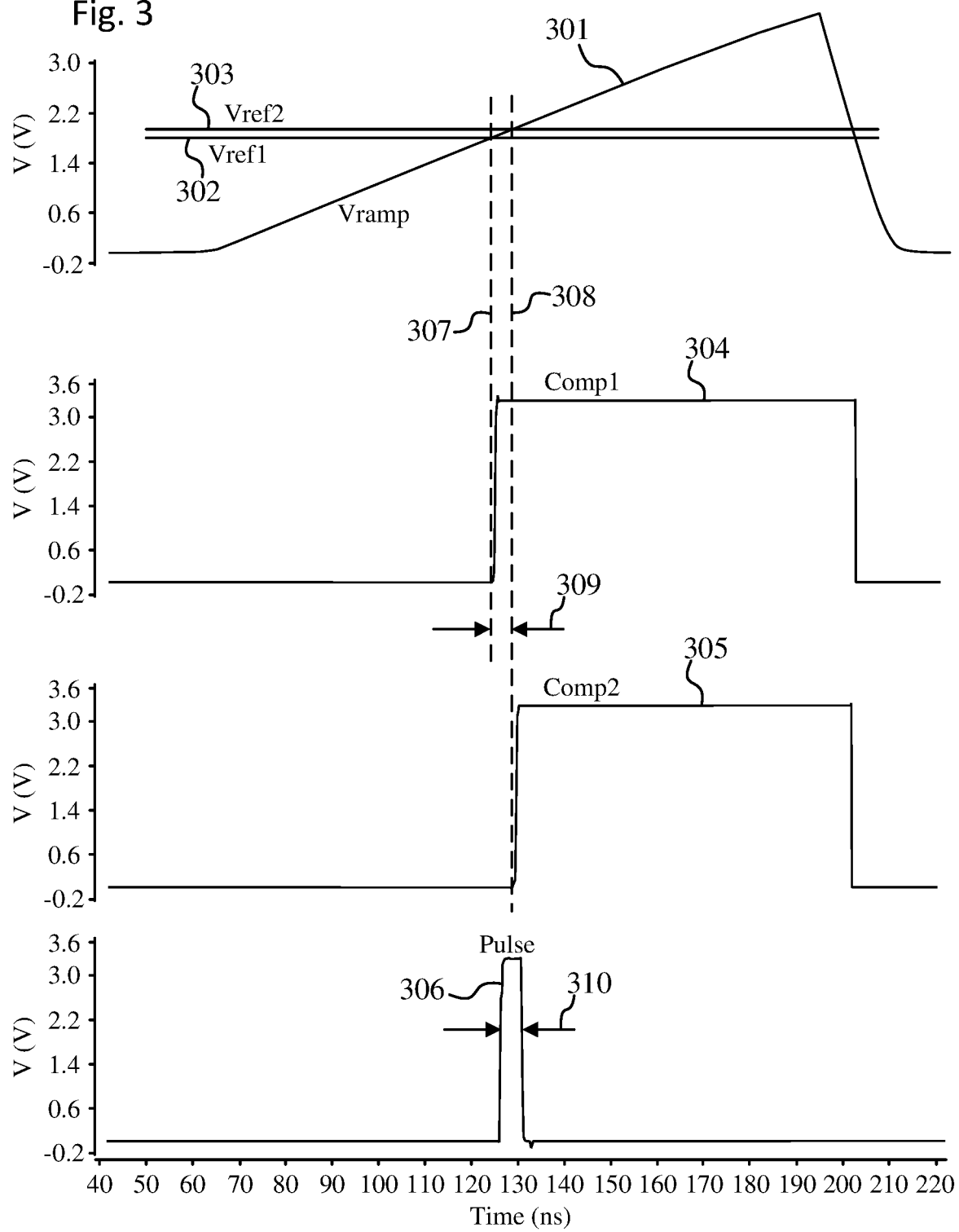
FIG. 3 shows example timing diagrams for operation of the pulse generators shown in FIGS. 1 and 2, in accordance with some embodiments.

FIG. 3 shows example timing diagrams illustrating the operation of the pulse generators 100 and 200 shown in FIGS. 1 and 2, in accordance with some embodiments. FIG. 3 includes a Vramp timing diagram 301 for the voltage ramp signal Vramp, a Vref1 timing diagram 302 for the first voltage level of the first reference voltage Vref1, a Vref2 timing diagram 303 for the second voltage level of the second reference voltage Vref2, a Comp1 timing diagram 304 for the output Comp1 of the first comparator 211, a Comp2 timing diagram 305 for the output Comp2 of the second comparator 212, and a pulse timing diagram 306 for the voltage pulse 101 or 201.

The Vramp timing diagram 301 and the Vref1 timing diagram 302 show that as the voltage ramp signal Vramp increases from a baseline value (i.e., from when the ramp switch 109 or 209 opens), the voltage ramp signal Vramp crosses above the set point or first voltage level of the first reference voltage Vref1 at point 307. Immediately afterward, the Comp1 timing diagram 304 shows that the output Comp1 of the first comparator 111 or 211 goes high (rising edge trigger point) from its baseline. Immediately after that, the pulse timing diagram 306 shows that the voltage pulse 101 or 201 goes high (rising edge) from its baseline in response to the rising edge of the output Comp1 of the first comparator 211. I.e., the rising edge of the voltage pulse 101 or 201 is caused by the first comparator output Comp1. Then the Vramp timing diagram 301 and the Vref2 timing diagram 303 show that as the voltage ramp signal Vramp continues to increase, the voltage ramp signal Vramp crosses above the set point or second voltage level of the second reference voltage Vref2 at point 308. Immediately afterward, the Comp2 timing diagram 305 shows that the output Comp2 of the second comparator 112 or 212 goes high (rising edge trigger point) from its baseline. Immediately after that, the pulse timing diagram 306 shows that the voltage pulse 101 or 201 goes low (falling edge) back to its baseline in response to the rising edge of the output Comp2 of the second comparator 212. I.e., the falling edge of the voltage pulse 101 or 201 is caused by the second comparator output Comp2. Sometime later, i.e., after the ramp switch 109 or 209 closes, timing diagrams 301-305 show that the voltage ramp signal Vramp quickly returns to its baseline, followed by the output Comp1 of the first comparator 111 or 211 and then the output Comp2 of the second comparator 112 or 212 going low (falling edges) back to their baselines after the voltage ramp signal Vramp crosses back below the second voltage level of the second reference voltage Vref2 and then the first voltage level of the first reference voltage Vref1. The duration 309 between the points 307 and 308 is, thus, about the same as the width 310 of the voltage pulse 101 or 201, which in the illustrated example is approximately 5 nanoseconds.

It is apparent from the timing diagrams 301-306 that if the first voltage level of the first reference voltage Vref1 were to be decreased or increased, then the trigger point for the output Comp1 of the first comparator 211 would occur earlier (or later, respectively) and the rising edge of the voltage pulse 101 or 201 would likewise occur earlier (or later, respectively) resulting in a wider (or narrower, respectively) pulse width. Additionally, it is also apparent from the timing diagrams 301-306 that if the second voltage level of the second reference voltage Vref2 were to be decreased or increased, then the trigger point for the output Comp2 of the second comparator 212 would occur earlier (or later, respectively) and the falling edge of the voltage pulse 101 or 201 would likewise occur earlier (or later, respectively) resulting in a narrower (or wider, respectively) pulse width. Furthermore, it is apparent from the pulse timing diagram 306 that the voltage pulse 101 or 201 is distinguished from a simple square wave waveform, since the voltage pulse 101 or 201 is of relatively short duration with a relatively small duty cycle; whereas, a simple square wave is generally symmetrical with about a 50% duty cycle. In the present invention, the short duration of the voltage pulse 101 or 201 is precisely controlled by the relationship between the first and second reference voltages Vref1 and Vref2 and the voltage ramp signal Vramp, which further results in an advantageous linear relationship of the pulse width to the difference between the resistance values of the resistors 102/202 and 103/203.

Figure 4:
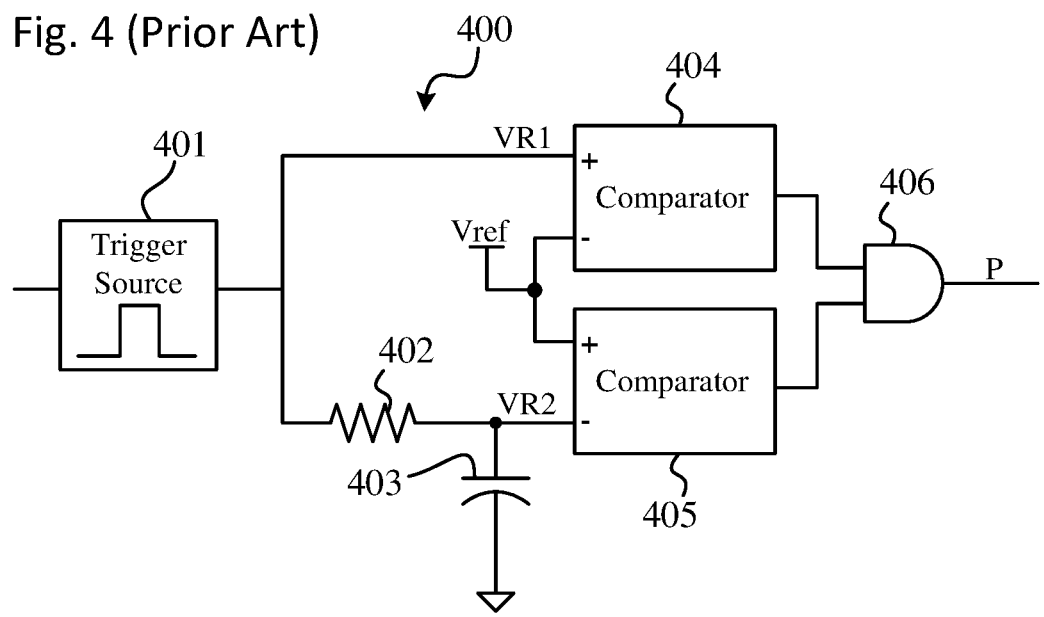
FIG. 4 is a simplified schematic diagram of an example prior art pulse generator.
Figure 5:
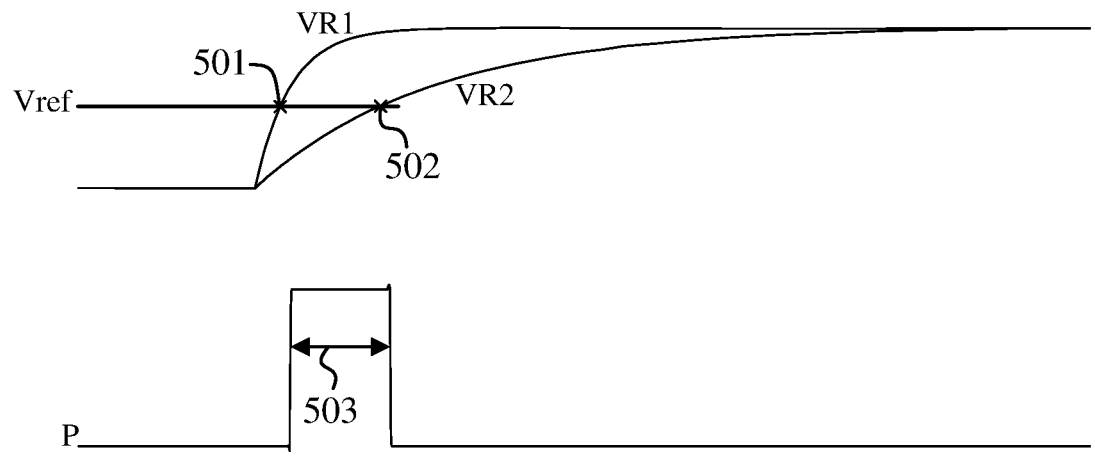
FIG. 5 shows example timing diagrams for operation of the example prior art pulse generator shown in FIG. 4.
Figure 6:
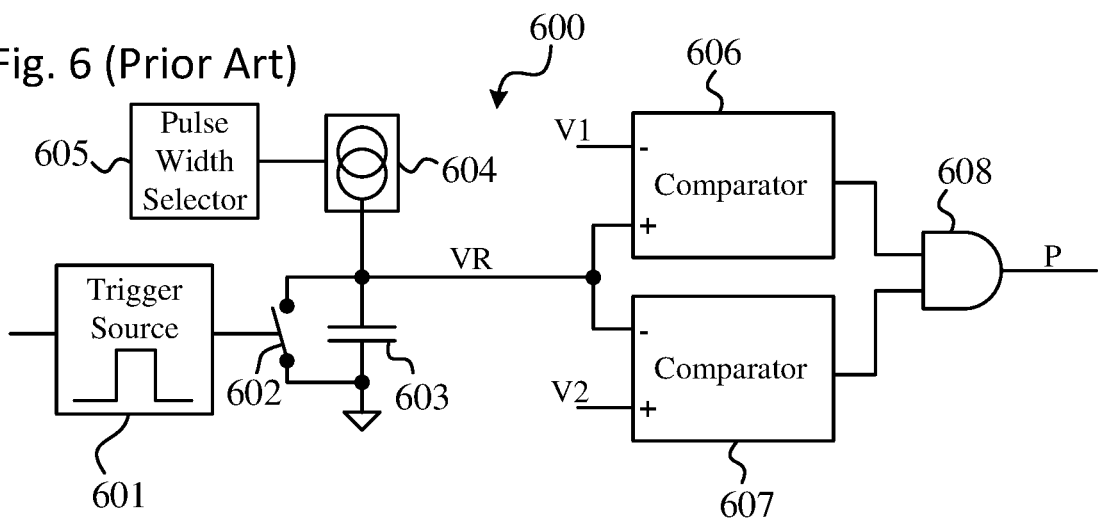
FIG. 6 is a simplified schematic diagram of another example prior art pulse generator.
Figure 7:
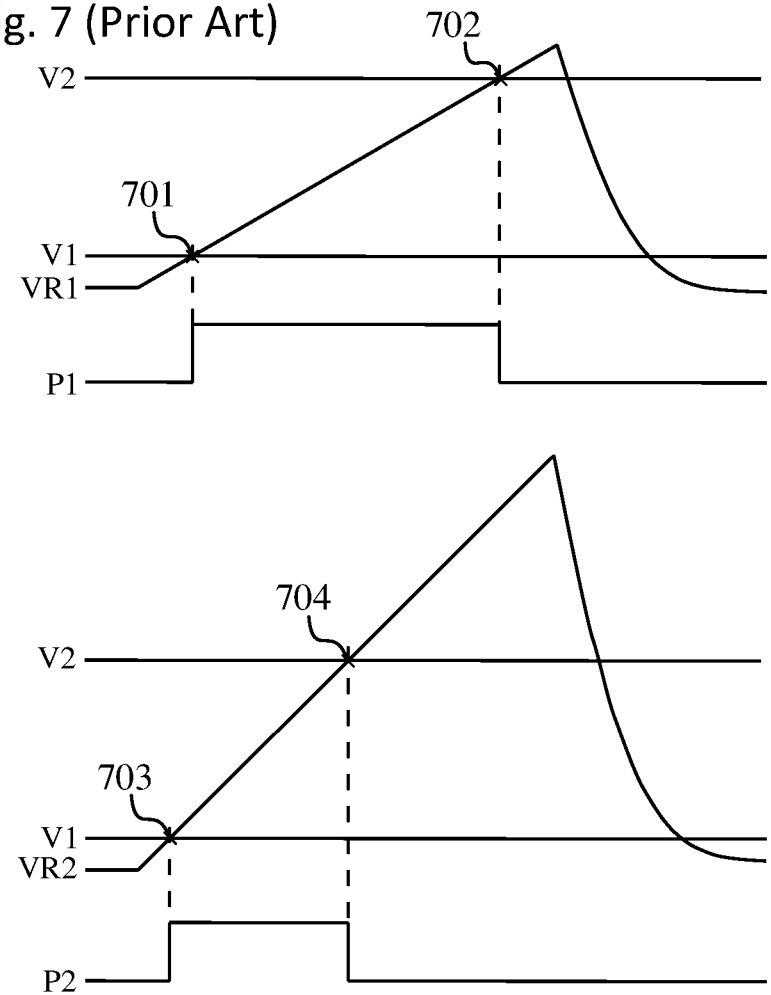
FIG. 7 shows example timing diagrams for operation of the example prior art pulse generator shown in FIG. 6.

Some advantages or improvements in the pulse generators 100 and 200 are more readily apparent by a comparison with example conventional pulse generator circuits. FIGS. 4 and 5 illustrate a first conventional pulse generator 400; and FIGS. 6 and 7 illustrate a second conventional pulse generator 600.

The conventional pulse generator 400 (FIG. 4) includes a trigger source 401, a resistor 402, a capacitor 403, a first comparator 404, a second comparator 405, and an AND gate 406. The comparators 404 and 405 are both tied to the same reference voltage Vref. However, the second comparator 405 has a delayed trigger point relative to that of the first comparator 404. The outputs of the comparators 404 and 405 are combined using the AND gate 406 to produce a voltage pulse P during a period of overlap of these outputs. The delay of the trigger point for the second comparator 405 is done with an RC circuit of the resistor 402 and the capacitor 403 (i.e., an RC low-pass filter) connected to the trigger source 401 and the first and second comparators 404 and 405 as shown, such that first and second ramp voltages VR1 (undelayed) and VR2 (delayed) are provided to the first and second comparators 404 and 405, respectively. In this configuration, a trigger signal from the trigger source 401 is converted into different exponential (nonlinear) changes in voltage for the first and second ramp voltages VR1 and VR2, which cross the reference voltage Vref at crossing points 501 and 502, respectively, which determine the width 503 of the voltage pulse P, as shown by timing diagrams in FIG. 5. The crossing points 501 and 502, and thus the width 503 of the voltage pulse P, can be changed by changing the resistor 402, the capacitor 403, or both. However, the nonlinear nature of the ramp voltages VR1 and VR2 makes it difficult to accurately predict the times of crossing points 501 and 502 and, thus, difficult to ensure accurate, reliable and repeatable control over the width 503 of the voltage pulse P. Thus, the width 503 of the voltage pulse P is a complicated function of the resistance of the resistor 402 and the capacitance of the capacitor 403. The present invention, on the other hand, enables the width 310 of the voltage pulse 101 or 201 (FIGS. 1-3) to be directly proportional to the difference between two resistances for the resistors 102/202 and 103/203. The present invention also enables quick and easy replacement of the resistors 102 and 103 or reprogramming of the resistors 202 and 203.

The conventional pulse generator 600 (FIG. 6) includes a trigger source 601, a switch 602, a capacitor 603, a current source 604, a pulse width selector 605, a first comparator 606, a second comparator 607, and an AND gate 608. The comparators 606 and 607 receive the same ramp voltage VR, but are tied to different reference voltages V1 and V2, respectively. The ramp voltage VR is generated by the current source 604 and the capacitor 603 under the control of the switch 602 and the trigger source 601. The ramp voltage VR is ramped up by the current source 604 providing a current to the capacitor 603 when the switch 602 is opened by a trigger signal from the trigger source 601; and the ramp voltage VR is quickly reset by the shorting of the capacitor 603 when the switch 602 is closed by the trigger signal. The first reference voltage V1 is lower than the second reference voltage V2; thus, the trigger point for the first comparator 606 is before the trigger point for the second comparator 607. The outputs of the comparators 606 and 607 are combined using the AND gate 608 to produce a voltage pulse P during a period of overlap of these outputs. The timing of the trigger points is changed by changing the slope of the ramp voltage VR, which is changed by changing the current provided by the current source 604. The pulse width selector 605 provides a control signal to the current source 604 to set the current provided thereby. This operation is illustrated by timing diagrams in FIG. 7. In a first example, the pulse width selector 605 causes the current source 604 to provide a first current to the capacitor 603, so the first example ramp voltage VR1 exhibits a first slope, resulting in crossing the reference voltages V1 and V2 at widely spaced points 701 and 702, respectively, for a first width of the first example voltage pulse P1. In a second example, the pulse width selector 605 causes the current source 604 to provide a second current (larger than the first current) to the capacitor 603, so the second example ramp voltage VR2 exhibits a second slope (greater than the first slope), resulting in crossing the reference voltages V1 and V2 at more closely spaced points 703 and 704, respectively, for a second width (narrower than the first width) of the second example voltage pulse P2. However, controlling the slope of the ramp voltage VR to control the width of the voltage pulse P can be difficult to do accurately and suffers from a practical limit on how high the slope can be and, thus, how narrow the voltage pulse P can be. The present invention, on the other hand, enables the width 310 of the voltage pulse 101 or 201 (FIGS. 1-3) to be a simple function directly proportional to the difference between two resistances for the resistors 102/202 and 103/203. The present invention also enables quick and easy replacement of the resistors 102 and 103 or reprogramming of the resistors 202 and 203, as well as an option to change the slope of the voltage ramp signal Vramp, to set the width 310 of the voltage pulse 101 or 201.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A pulse generator comprising:
a first reference voltage generator that generates a first reference voltage at a first voltage level based on a first resistance value;
a second reference voltage generator that generates a second reference voltage at a second voltage level based on a second resistance value that is different from the first resistance value;
a ramp generator producing a ramp signal that crosses from a point below the first and second voltage levels to a point above the first and second voltage levels;
a first comparator receiving the first reference voltage and the ramp signal and producing a first comparator output in response to the ramp signal crossing from below to above the first voltage level;
a second comparator receiving the second reference voltage and the ramp signal and producing a second comparator output in response to the ramp signal crossing from below to above the second voltage level; and
logic circuitry connected to receive the first and second comparator outputs and to generate a pulse signal in response thereto, a rising edge of the pulse signal being caused by the first comparator output, a falling edge of the pulse signal being caused by the second comparator output, a width of the pulse signal being directly proportional to a difference between the first and second resistance values, and a duty cycle of the pulse signal being substantially less than 50%.

2. The pulse generator of claim 1, wherein:
the ramp signal is linear within an operating range that includes the first and second voltage levels.

3. The pulse generator of claim 1, further comprising:
a programmable resistance circuitry comprising first and second resistors having the first and second resistance values, respectively, wherein at least one of the first and second resistors is a programmable resistor; and
a programmable data interface through which resistance data is received to set at least one of the first and second resistance values by programming the at least one of the first and second resistors.

4. The pulse generator of claim 3, wherein:
the first reference voltage generator comprises the first resistor and a first current source;
the first current source is connected to the first resistor to generate the first reference voltage at the first voltage level by providing a first current through the first resistor;
the second reference voltage generator comprises the second resistor and a second current source;
the second current source is connected to the second resistor to generate the second reference voltage at the second voltage level by providing a second current through the second resistor;
at least one of the first and second voltage levels of at least one of the first and second reference voltages is set by setting the at least one of the first and second resistance values for the at least one of the first and second resistors; and
the width of the pulse signal is set by setting the at least one of the first and second voltage levels.

5. The pulse generator of claim 4, wherein:
at least one of the first and second current sources is a programmable current source;
at least one of the first and second currents of the at least one of the first and second current sources is set according to current data received via the programmable data interface for the at least one of the first and second current sources; and
the at least one of the first and second voltage levels is further set by setting the at least one of the first and second currents.

6. The pulse generator of claim 5, wherein:
the ramp generator comprises a capacitor and a third current source;
the third current source is connected to the capacitor to generate the ramp signal as a linear ramp signal within an operating range that includes the first and second voltage levels by providing a third current to the capacitor;
the third current source is a programmable current source;
the third current is set according to the current data via the programmable data interface also for the third current source;
a slope of the linear ramp signal is set by setting the third current source; and
the width of the pulse signal is further set by setting the slope of the linear ramp signal.

7. The pulse generator of claim 1, wherein:
the first reference voltage generator comprises a first resistor and a first current source;
the first resistor has the first resistance value;
the first current source is connected to the first resistor to generate the first reference voltage at the first voltage level by providing a first current through the first resistor;
the second reference voltage generator comprises a second resistor and a second current source;
the second resistor has the second resistance value; and
the second current source is connected to the second resistor to generate the second reference voltage at the second voltage level by providing a second current through the second resistor.

8. The pulse generator of claim 7, wherein:
at least one of the first and second current sources is a programmable current source;
the pulse generator further comprises a programmable data interface through which current data is received for programming the at least one of the first and second current sources;
at least one of the first and second currents of the at least one of the first and second current sources is set according to the current data by programming the at least one of the first and second current sources;
at least one of the first and second voltage levels is set by setting the at least one of the first and second currents; and
the width of the pulse signal is set by setting the at least one of the first and second voltage levels.

9. The pulse generator of claim 7, further comprising:
an integrated circuit chip that includes the first and second current sources, at least part of the ramp generator, the first and second comparators, and the logic circuitry;
wherein at least one of the first and second resistors is external to the integrated circuit chip and selectable to set the width of the pulse signal.

10. A method comprising:
generating a first reference voltage at a first voltage level by applying a first current to a first resistor having a first resistance value;
generating a second reference voltage at a second voltage level by applying a second current to a second resistor having a second resistance value that is different from the first resistance value;
generating a ramp signal that crosses from a point below the first and second voltage levels to a point above the first and second voltage levels;
generating a first comparator output based on the first reference voltage and the ramp signal;
generating a second comparator output based on the second reference voltage and the ramp signal; and
generating a pulse signal in response to the first and second comparator outputs, a rising edge of the pulse signal being caused by the first comparator output, a falling edge of the pulse signal being caused by the second comparator output, a width of the pulse signal being directly proportional to a difference between the first and second resistance values, and a duty cycle of the pulse signal being substantially less than 50%.

11. The method of claim 10, wherein:
the ramp signal is linear within an operating range that includes the first and second voltage levels.

12. The method of claim 10, wherein:
at least one of the first and second resistors is programmable to set at least one of the first and second resistance values; and
the method further comprises:
receiving resistance data through a programmable data interface;
setting the at least one of the first and second resistance values by programming the at least one of the first and second resistors according to the resistance data; and
setting the width of the pulse signal by the setting of the at least one of the first and second resistance values.

13. The method of claim 12, further comprising:
setting at least one of the first and second reference voltages by the setting of the at least one of the first and second resistance values; and
further setting the width of the pulse signal by the setting of the at least one of the first and second reference voltages.

14. The method of claim 13, wherein:
the first and second currents are provided by first and second current sources, respectively;
at least one of the first and second current sources is programmable to set at least one of the first and second currents; and
the method further comprises:
receiving current data through the programmable data interface;
setting the at least one of the first and second currents by programming the at least one of the first and second current sources according to the current data; and
further setting the width of the pulse signal by the setting of the at least one of the first and second currents.

15. The method of claim 14, wherein:
the generating of the ramp signal is performed by a third current source applying a third current to a capacitor;
the third current source is programmable to set the third current; and
the method further comprises:
setting the third current by programming the third current source also according to the current data; and
further setting the width of the pulse signal by the setting of the third current.

16. The method of claim 10, wherein:
the generating of the first reference voltage further comprises providing the first current from a first current source to the first resistor;
the generating of the second reference voltage further comprises providing the second current from a second current source to the second resistor;
the generating of the ramp signal is performed by a ramp generator;
the generating of the first comparator output further comprises a first comparator receiving the first reference voltage and the ramp signal and producing the first comparator output in response thereto;
the generating of the second comparator output further comprises a second comparator receiving the second reference voltage and the ramp signal and producing the second comparator output in response thereto; and
the generating of the pulse signal further comprises a logic circuitry receiving the first and second comparator outputs and generating the pulse signal in response thereto.

17. The method of claim 16, wherein:
the first and second currents are provided by first and second current sources, respectively;
at least one of the first and second current sources is programmable to set at least one of the first and second currents; and
the method further comprises:
receiving current data through a programmable data interface;
setting the at least one of the first and second currents by programming the at least one of the first and second current sources according to the current data; and
setting the width of the pulse signal by the setting of the at least one of the first and second currents.

18. The method of claim 16, wherein:
the first and second current sources, at least part of the ramp generator, the first and second comparators, and the logic circuitry are included in an integrated circuit chip; and the first and second resistors are external to the integrated circuit chip and selectable to set the width of the pulse signal.

* * * * *